United States Patent
Mizunashi et al.

(10) Patent No.: US 9,695,301 B2
(45) Date of Patent: Jul. 4, 2017

(54) NANOPARTICLE, METHOD FOR PRODUCING NANOPARTICLE, ADDITION CURING SILICONE RESIN COMPOSITION, AND SEMICONDUCTOR APPARATUS

(71) Applicant: SHIN-ETSU CHEMICAL CO., LTD., Tokyo (JP)

(72) Inventors: Tomoyuki Mizunashi, Annaka (JP); Takayuki Kusunoki, Annaka (JP); Yuusuke Takamizawa, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 15/146,102

(22) Filed: May 4, 2016

(65) Prior Publication Data

US 2016/0355671 A1 Dec. 8, 2016

(30) Foreign Application Priority Data

Jun. 5, 2015 (JP) ................. 2015-114428

(51) Int. Cl.
| | | |
|---|---|---|
| *H01L 51/54* | (2006.01) | |
| *C08K 9/04* | (2006.01) | |
| *H01L 51/52* | (2006.01) | |
| *C08K 9/06* | (2006.01) | |
| *C08K 3/36* | (2006.01) | |
| *C09D 183/04* | (2006.01) | |
| *C08G 77/12* | (2006.01) | |
| *C08G 77/20* | (2006.01) | |
| *C08L 83/04* | (2006.01) | |
| *C08G 77/00* | (2006.01) | |
| *C08G 77/08* | (2006.01) | |
| *H01L 23/29* | (2006.01) | |
| *H01L 33/56* | (2010.01) | |

(52) U.S. Cl.
CPC ............... *C08K 9/06* (2013.01); *C08G 77/08* (2013.01); *C08G 77/12* (2013.01); *C08G 77/20* (2013.01); *C08G 77/70* (2013.01); *C08G 77/80* (2013.01); *C08K 3/36* (2013.01); *C08L 83/04* (2013.01); *C09D 183/04* (2013.01); *H01L 23/295* (2013.01); *H01L 23/296* (2013.01); *H01L 33/56* (2013.01)

(58) Field of Classification Search
CPC . C08K 9/06; C08K 3/36; C08G 77/14; C08G 77/12; C08G 77/20; C08G 77/70; C08G 77/80; H01L 23/295; H01L 33/56; H01L 2933/0033; H01L 23/296; H01L 2251/5369; H01L 51/5268; H01L 51/5275; C08L 83/04
See application file for complete search history.

(56) References Cited

U.S. PATENT DOCUMENTS

| | | | |
|---|---|---|---|
| 4,344,800 A | 8/1982 | Lutz | |
| 6,124,407 A | 9/2000 | Lee et al. | |
| 2009/0118441 A1 | 5/2009 | Yamamoto et al. | |
| 2014/0197387 A1* | 7/2014 | Miyao | C08J 5/005 257/40 |
| 2015/0098212 A1* | 4/2015 | Won | G02F 1/133615 362/97.3 |

FOREIGN PATENT DOCUMENTS

| | | | | |
|---|---|---|---|---|
| EP | 2226360 A1 | 9/2010 | | |
| EP | 2392607 A2 | 12/2011 | | |
| EP | 2679636 A1 | 1/2014 | | |
| EP | 2845880 A1 | 3/2015 | | |
| JP | 2006-213789 A | 8/2006 | | |
| JP | 2007-131694 A | 5/2007 | | |
| JP | 2011-252175 A | 12/2011 | | |
| JP | 2012-214554 A | 11/2012 | | |
| JP | 2013-204029 A | 10/2013 | | |
| JP | 2014-125401 | * | 7/2014 | ............ C01G 9/02 |

OTHER PUBLICATIONS

Oct. 7, 2016 Extended Search Report issued in European Patent Application No. 16001052.6.

* cited by examiner

*Primary Examiner* — Jasmine Clark
(74) *Attorney, Agent, or Firm* — Oliff PLC

(57) ABSTRACT

The present invention provides a nanoparticle of an inorganic oxide particle being surface-treated, wherein: a primary particle size of the nanoparticle measured by a dynamic light scattering method is 8 nm or more and 30 nm or less, and the inorganic oxide particle is surface-treated in such a way that alkoxy groups having 1 to 10 carbon atoms are contained in a range of 0.001 to 0.5 mol/100 g. The inventive nanoparticle, being added to a silicone resin composition, enables the cured product thereof to possess excellent mechanical properties, transparency, crack resistance, heat resistance, and gas barrier properties, and enables the composition to have low viscosity and good workability even after the addition of the nanoparticle.

19 Claims, No Drawings

NANOPARTICLE, METHOD FOR PRODUCING NANOPARTICLE, ADDITION CURING SILICONE RESIN COMPOSITION, AND SEMICONDUCTOR APPARATUS

BACKGROUND OF THE INVENTION

Field of the Invention

The present invention relates to a nanoparticle of an inorganic oxide particle having a reactive group on the surface, a method for producing the nanoparticle, an addition curing silicone resin composition which contains the nanoparticle, and a semiconductor apparatus in which a semiconductor device is encapsulated by the composition.

Description of the Related Art

As an encapsulant for LED, it has been required for a material with high transparency, high refractive index, as well as excellent mechanical properties, heat resistance, and light resistance; and thermoplastic resins such as an epoxy resin, poly(meth)acrylate, and polycarbonate have been frequently used conventionally. Due to a recent trend toward higher output of LED light emitting apparatus, however, it has come to be found that use of these thermoplastic resins causes a problem of heat resistance or discoloration resistance under a condition of a high temperature over a prolonged period of time.

In addition, lead-free solders are often used in recent years when an optical device is soldered to a substrate. The lead-free solders have higher melting point than the conventional solders, and accordingly the soldering have to be generally carried out at a temperature of 260° C. or higher. It has also come to be found that when soldering is carried out such a temperature, encapsulant of the foregoing conventional thermoplastic resin occurs problems such as deformation and yellowing of the encapsulant due to a high temperature.

As described above, encapsulants are required to have more excellent heat resistance compared to previous ones due to a trend toward higher output of LED light emitting apparatus and use of lead-free solders. In order to improve the heat resistance, an optical resin composition in which nano-silica is added to a thermoplastic resin and so on have been proposed (Patent Documents 1 and 2). Thermoplastic resins, however, possess a limitation of heat resistance, and accordingly fail to give sufficient heat resistance.

Silicone resins, which are thermosetting resins, have been studied as an encapsulant for LED since they possessed excellent heat resistance, light resistance, and light transparency (Patent Documents 3 to 5). These silicone resins, however, have lower resin strength and larger gas permeability (i.e., low gas barrier property) compared to epoxy resins, thereby having a disadvantage such as sulfidation of an electrode to cause lowering of the luminance.

In addition, when a silicone resin such as one containing a silicate based fluorescent substance is used as an encapsulant for LED, the silicone resin encapsulant with low gas barrier property is penetrated with water vapor, and the water reacts on the surface of the fluorescent substance to decompose the fluorescent substance. Accordingly, there also arises a problem of considerable lowering of fluorescent property. As described above, when conventional silicone resins are used as an encapsulant for LED, there arises a problem of lowering of a long-time reliability of LED under high humidity as well as a problem of lowering of a luminance due to sulfidation of an electrode. Consequently, a demand for improving gas barrier properties of a silicone resin is now increasing.

As a countermeasure to this, an introduction of an aromatic substituent such as a phenyl group has been studied to increase the refractive index and to improve the gas barrier properties. The introduction of an aromatic substituent, however, increases the change of viscoelasticity at heating, thereby causing a problem of lowering the crack resistance compared to methylsilicone based resins. There also arises a problem of lowering the heat resistance. Accordingly, it has been required to develop an encapsulant with good workability, as well as excellent mechanical properties, transparency, crack resistance, heat resistance, and gas barrier properties after curing.

PRIOR ART DOCUMENTS

Patent Documents

Patent Document 1: Japanese Patent Laid-Open Publication No. 2012-214554
Patent Document 2: Japanese Patent Laid-Open Publication No. 2013-204029
Patent Document 3: Japanese Patent Laid-Open Publication No. 2006-213789
Patent Document 4: Japanese Patent Laid-Open Publication No. 2007-131694
Patent Document 5: Japanese Patent Laid-Open Publication No. 2011-252175

SUMMARY OF THE INVENTION

The present invention was made in order to solve the foregoing problems, and an object thereof is to provide a nanoparticle which is added to a silicone resin composition and makes the cured product thereof having excellent mechanical properties, transparency, crack resistance, heat resistance, and gas barrier properties, and enables the composition to have low viscosity and good workability even after the addition of the nanoparticle; a method for producing the nanoparticle; an addition curing silicone resin composition which contains the nanoparticle; and a semiconductor apparatus in which a semiconductor device is encapsulated by the composition.

To accomplish the object, the present invention provides a nanoparticle of an inorganic oxide particle being surface-treated, wherein:

a primary particle size of the nanoparticle measured by a dynamic light scattering method is 8 nm or more and 30 nm or less, and the inorganic oxide particle is surface-treated in such a way that alkoxy groups having 1 to 10 carbon atoms are contained in a range of 0.001 to 0.5 mol/100 g.

Such nanoparticle, being added to a silicone resin composition, enables the cured product thereof to possess excellent mechanical properties, transparency, crack resistance, heat resistance, and gas barrier properties, and enables the composition to have low viscosity and good workability even after the addition of the nanoparticle.

It is preferable that the inorganic oxide particle be any of silicon dioxide particle, zirconium oxide particle, titanium oxide particle, aluminum oxide particle, and zinc oxide particle.

When a nanoparticle of such an inorganic oxide particle being surface-treated is added to a silicone resin composition, the cured product thereof can have more improved transparency.

It is also preferable that the nanoparticle contain a silicon atom-bonded hydrogen atom and/or at least one functional group selected from an alkyl group having 1 to 10 carbon atoms, a fluoroalkyl group having 1 to 10 carbon atoms in which at least one hydrogen atom of an alkyl group is substituted with a fluorine atom, an alkoxy group having 1 to 10 carbon atoms, an aryl group having 6 to 10 carbon atoms, an alkenyl group having 2 to 10 carbon atoms, a hydroxyl group, an epoxy group, and a (meth)acryl group.

When a nanoparticle having such a functional group is added to a silicone resin composition, it is possible to further improve the workability of the component; and the mechanical properties, the transparency, the crack resistance, the heat resistance, the gas barrier properties, etc. of the cured product.

The present invention also provides an addition curing silicone resin composition, comprising organopolysiloxane having a silicon atom-bonded alkenyl group, an organosilicon compound having a silicon atom-bonded hydrogen atom, and an addition reaction catalyst, further comprising the foregoing nanoparticle.

Such an addition curing silicone resin composition has low viscosity and good workability, and gives a cured product with excellent mechanical properties, transparency, crack resistance, heat resistance, gas barrier properties.

The addition curing silicone resin composition preferably contains:

(A) a linear organopolysiloxane having two or more alkenyl groups in one molecule with a viscosity of 10 to 1,000,000 mPa·s at 25° C. measured by the method described in JIS K 7117-1:1999;

(B) a branched organopolysiloxane comprising either or both of an $SiO_{4/2}$ unit and an $RSiO_{3/2}$ unit ("R" independently represents a monovalent hydrocarbon group having 1 to 10 carbon atoms), having two or more silicon atom-bonded alkenyl groups in one molecule, and having at least one group selected from a silicon atom-bonded alkoxy group having 1 to 10 carbon atoms and a silanol group in one molecule, and the total amount of the silicon atom-bonded alkoxy groups having 1 to 10 carbon atoms and the silanol groups in the component (B) is 0.01 to 0.6 mol/100 g, wherein the amount of the component (B) is 1 to 99% by mass relative to the total amount of the component (A) and the component (B);

(C) an organosilicon compound having two or more silicon atom-bonded hydrogen atoms and at least one silicon atom-bonded aryl group in one molecule, wherein the amount is such that an amount of the silicon atom-bonded hydrogen atoms in the component (C) is 0.1 to 4.0 mol relative to 1 mol of the total amount of the alkenyl groups in the component (A) and the component (B);

(D) a platinum group metal based catalyst, wherein the amount is a catalytic amount; and (E) the nanoparticle, wherein the amount is 1 to 99% by mass relative to the total amount of the composition.

By containing the foregoing components (A) to (E), it is possible to further improve the workability of the component; and mechanical properties, transparency, crack resistance, heat resistance, gas barrier properties, etc. of the cured product.

It is also preferable that 10 to 80% of the silicon atom-bonded groups contained in the addition curing silicone resin composition be an aryl group.

Such an addition curing silicone resin composition has superior workability, and can give a cured product with further improved reflective index and gas barrier properties.

It is also preferable that the addition curing silicone resin composition have a viscosity of 10 to 1,000,000 mPa·s at 25° C. measured by the method described in JIS K 7117-1:1999 when the component (E) is contained in an amount of 10% by mass relative to the total amount of the composition; and a viscosity ratio (x/y) be in a range of 0.5 to 3.0, where "x" is a viscosity of a composition X consisting of the components (A) to (E) at 25° C. measured by the method described in JIS K 7117-1:1999, "y" is a viscosity of a composition Y consisting of the components (A) to (D) contained in the composition X at 25° C. measured by the method described in JIS K 7117-1:1999.

Such an addition curing silicone resin composition shows superior workability.

The inventive addition curing silicone resin composition can further comprise (F) a fluorescent substance.

The inventive addition curing silicone resin composition gives a cured product with excellent gas barrier properties, and, unlike the conventional arts, it does not have a risk to lower the fluorescent property significantly even when containing a fluorescent substance.

It is also preferable that the addition curing silicone resin composition give a cured product with a direct light transmittance of 70% or more at a wavelength of 450 nm when cured by heating to a thickness of 1 mm.

It is also preferable that the addition curing silicone resin composition give a cured product with a refractive index of 1.37 to 1.57 when cured by heating.

The composition which gives a cured product having such a direct light transmittance or a refractive index is particularly preferable for optical uses such as an encapsulant for LED.

The present invention also provides a semiconductor apparatus in which a semiconductor device is encapsulated by a cured product of the foregoing addition curing silicone resin composition.

Such a semiconductor apparatus exhibits excellent long-time reliability under high humidity (water-vapor resistance) and long-time color rendering property, with the semiconductor device being encapsulated by a cured product with excellent mechanical properties, transparency, crack resistance, heat resistance, and gas barrier properties.

The present invention also provide a method for producing a nanoparticle by surface-treatment of an inorganic oxide particle, wherein:

reacting an inorganic oxide particle having a primary particle size of 3 nm or more and 30 nm or less measured by a dynamic light scattering method with a surface-treatment agent containing an alkoxy group having 1 to 10 carbon atoms at 20 to 150° C. for 1 to 72 hours to perform a surface-treatment of the inorganic oxide particle in such a way that the alkoxy groups having 1 to 10 carbon atoms are contained in a range of 0.001 to 0.5 mol/100 g.

Such a producing method can effectively and easily produce a nanoparticle in which an inorganic oxide particle is surface-treated in such a way that the alkoxy groups having 1 to 10 carbon atoms are contained in a range of 0.001 to 0.5 mol/100 g.

As described above, the inventive nanoparticle, being added to a silicone resin composition, enables the cured product thereof to possess excellent mechanical properties, transparency, crack resistance, heat resistance, and gas barrier properties, and enables the composition to have low viscosity and good workability even after the addition of the nanoparticle. Accordingly, the inventive addition curing silicone resin composition which contains such an inventive nanoparticle is particularly suitable for a lens material, a protective coating agent, a molding agent, etc. for a light emitting semiconductor apparatus. Moreover, the inventive addition curing silicone resin composition has excellent gas barrier properties, and therefore it can provide a light emitting semiconductor apparatus which can secure long-time reliability under high humidity and has excellent water-vapor resistance and long-time color rendering property even when used as a wavelength conversion film by adding a silicate based fluorescent substance or a quantum dot fluorescent substance with inferior water resistance.

DETAILED DESCRIPTION OF THE PREFERRED EMBODIMENTS

As mentioned above, it has been desired to further improve the moisture resistance and gas barrier properties of an encapsulant while retaining the high transparency with respect to the requirements of ultra-fineness, high heat resistance, high moisture resistance, and long-time reliability, as well as the use condition in recent semiconductor apparatuses.

The present inventors has diligently studied to accomplish the above-mentioned objects and consequently found that by using a nanoparticle with a certain primary particle size and surface-treated in such a way that an inorganic oxide particle contains a certain amount of alkoxy groups, which is added to a silicone resin composition, it is possible to make the cured product thereof having excellent mechanical properties, transparency, crack resistance, heat resistance, and gas barrier properties, and it is also possible to make the composition having low viscosity and good workability even after the addition of the nanoparticle; furthermore, such a silicone resin composition can be favorably used as an encapsulant for semiconductor devices such as LED; thereby brought the present invention to completion.

That is, the present invention is a nanoparticle of an inorganic oxide particle being surface-treated, wherein: a primary particle size of the nanoparticle measured by a dynamic light scattering method is 8 nm or more and 30 nm or less, and the inorganic oxide particle is surface-treated in such a way that alkoxy groups having 1 to 10 carbon atoms are contained in a range of 0.001 to 0.5 mol/100 g.

Hereinafter, the present invention will be described in detail, but the present invention is not limited thereto. In addition, in the present specification, Me represents a methyl group, Et represents an ethyl group, Vi represents a vinyl group, and Ph represents a phenyl group.

<Nanoparticle>

The nanoparticle of the present invention is a nanoparticle of an inorganic oxide particle being surface-treated, in which the primary particle size measured by a dynamic light scattering method is 8 nm or more and 30 nm or less. When the nanoparticle with the primary particle size of less than 8 nm is added to a silicone resin composition, it is not possible to obtain a reinforcing effect of the cured product, nor to expect an improvement of crack resistance of the cured product. On the other hand, when the primary particle size of the nanoparticle is more than 30 nm, the compatibility with a silicone resin is lowered, the viscosity of the composition is increased to deteriorate the workability of the composition, and the transparency of the cured product is lowered.

The inventive nanoparticle is one in which the inorganic oxide particle is surface-treated in such a way that alkoxy groups having 1 to 10 carbon atoms are contained in a range of 0.001 to 0.5 mol/100 g. The amount of the alkoxy groups in the nanoparticle can be measured by $^1$H-NMR, $^{29}$Si-NMR, for example. When the amount of the alkoxy groups is less than 0.001 mol/100 g, the reactivity of the surface of a nanoparticle is lowered, thereby lowering the mechanical properties and gas barrier properties of the cured product when the nanoparticle is added to a silicone resin composition. On the other hand, when the amount of the alkoxy group is more than 0.5 mol/100 g, the reactivity of the nanoparticle get too high, which makes it difficult to control the curing when the nanoparticle is added to a silicone resin composition, and thereby causes deterioration of the resin.

The inventive nanoparticle is one in which the inorganic oxide particle is surface-treated. Illustrative examples of the inorganic oxide particle include silicon dioxide (silica: $SiO_2$), zirconium oxide (zirconia: $ZrO_2$), titanium oxide ($TiO_2$), aluminum oxide (alumina: $Al_2O_3$), zinc oxide (ZnO), iron oxide ($FeO_2$), tri-iron tetroxide ($Fe_3O_4$), lead oxide ($PbO_2$), tin oxide ($SnO_2$), cerium oxide ($CeO_2$), calcium oxide (CaO), tri-manganese tetroxide ($Mn_3O_4$), and magnesium oxide (MgO). These inorganic oxide particles may be used alone or in combination of two or more kinds. Among these, silicon dioxide, zirconium oxide, titanium oxide, aluminum oxide, and zinc oxide are preferable, and silicon dioxide and zirconium oxide are particularly preferable. By using these inorganic oxide particles, being added to a silicone resin composition, the transparency of the cured product can be further improved.

It is preferable that the inventive nanoparticle contain a silicon atom-bonded hydrogen atom and/or at least one functional group selected from an alkyl group having 1 to 10 carbon atoms, a fluoroalkyl group having 1 to 10 carbon atoms in which at least one hydrogen atom of an alkyl group is substituted with a fluorine atom, an alkoxy group having 1 to 10 carbon atoms, an aryl group having 6 to 10 carbon atoms, an alkenyl group having 2 to 10 carbon atoms, a hydroxyl group, an epoxy group, and a (meth)acryl group. When the nanoparticle having such a functional group is added to a silicone resin composition, it is possible to further improve the workability of the composition, as well as the mechanical properties, the transparency, the crack resistance, the heat resistance, the gas barrier properties of the cured product.

As a surface-treatment method of the inorganic oxide particle, any known method can be applied. Although dry processes and wet processes are known as a surface-treatment method of an inorganic oxide particle, inorganic oxide particles with nano-size are commonly provides in solution base. Accordingly, a wet process with a solution base is preferable also in view of uniform treatment of inorganic oxide particles and preventing gelation.

Accordingly, the present invention provides a method for producing a nanoparticle by surface-treatment of an inorganic oxide particle, in which reacting an inorganic oxide particle having a primary particle size of 3 nm or more and 30 nm or less measured by a dynamic light scattering method with a surface-treatment agent containing an alkoxy group having 1 to 10 carbon atoms at 20 to 150° C. for 1 to 72 hours to perform a surface-treatment of the inorganic oxide particle in such a way that the alkoxy groups having 1 to 10 carbon atoms are contained in a range of 0.001 to 0.5 mol/100 g.

When the reaction is carried out at a temperature below 20° C., the rate of a surface-treatment gets lower. When the reaction is carried out at a temperature of more than 150° C., it gets difficult to control the reaction, which causes coloring. The reaction time of less than 1 hour gives insufficient treatment, and the reaction time of more than 72 hours lowers the productivity.

AS a surface-treatment agent, the compounds described below and oligomers of dimers to pentamers thereof can be mentioned, although not limited thereto:

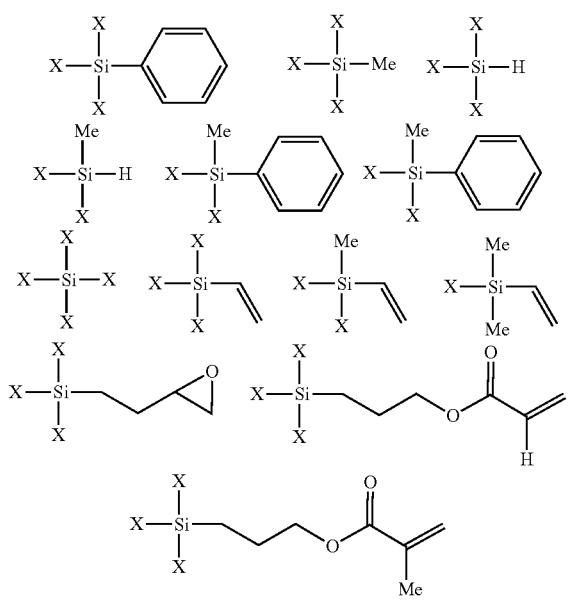

wherein, each "X" independently represents alkoxy group having 1 to 10 carbon atoms, a halogen atom, an acetate group, a hydroxyl group, —CR'$_2$—CO—CR'$_3$ group (each "R'" represent a hydrogen atom or the same or different monovalent hydrocarbon group having 1 to 10 carbon atoms), or —CR'$_2$—CO—OR' group ("R'" has the same meanings as in the foregoing).

Such an inventive nanoparticle, being added to a silicone resin composition, enables to make the cured product thereof having excellent mechanical properties, transparency, crack resistance, heat resistance, and gas barrier properties, and enables the composition to have low viscosity and good workability even after the addition of the nanoparticle. Moreover, the foregoing inventive producing method can produce such an inventive nanoparticle efficiently and easily.

<Addition Curing Silicone Resin Composition>

The present invention provides an addition curing silicone resin composition, comprising organopolysiloxane having a silicon atom-bonded alkenyl group, an organosilicon compound having a silicon atom-bonded hydrogen atom, and an addition reaction catalyst, further comprising the foregoing inventive nanoparticle.

More specifically, the inventive addition curing silicone resin composition preferably contains:

(A) a linear organopolysiloxane having two or more alkenyl groups in one molecule with a viscosity of 10 to 1,000,000 mPa·s at 25° C. measured by the method described in JIS K 7117-1:1999;

(B) a branched organopolysiloxane comprising either or both of an SiO$_{4/2}$ unit and an RSiO$_{3/2}$ unit ("R" independently represents a monovalent hydrocarbon group having 1 to 10 carbon atoms), having two or more silicon atom-bonded alkenyl groups in one molecule, and having at least one group selected from a silicon atom-bonded alkoxy group having 1 to 10 carbon atoms and a silanol group in one molecule, and the total amount of the silicon atom-bonded alkoxy groups having 1 to 10 carbon atoms and the silanol groups in the component (B) is 0.01 to 0.6 mol/100 g, wherein the amount of the component (B) is 1 to 99% by mass relative to the total amount of the component (A) and the component (B);

(C) an organosilicon compound having two or more silicon atom-bonded hydrogen atoms and at least one silicon atom-bonded aryl group in one molecule, wherein the amount is such that an amount of the silicon atom-bonded hydrogen atoms in the component (C) is 0.1 to 4.0 mol relative to 1 mol of the total amount of the alkenyl groups in the component (A) and the component (B);

(D) a platinum group metal based catalyst, wherein the amount is a catalytic amount; and (E) the above-mentioned nanoparticle, wherein the amount is 1 to 99% by mass relative to the total amount of the composition.

[(A) Linear Organopolysiloxane]

The component (A) is a linear organopolysiloxane having two or more alkenyl groups in one molecule. The alkenyl group preferably has 2 to 8 carbon atoms, particularly 2 to 6 carbon atoms, and preferable example thereof include a vinyl group and an allyl group.

The component (A) also has a viscosity of 10 to 1,000,000 mPa·s, preferably 100 to 500,000 mPa·s at 25° C. The viscosity of 10 mPa·s or more makes the molding easy, and the viscosity of 1,000,000 mPa·s or less enables to handle it easily and to suppress occurrence of a void. It is to be noted that in the present specification, the viscosities are values measured at 25° C. with a rotational viscometer by the method described in JIS K 7117-1:1999.

The component (A) is preferably a linear organopolysiloxane having at least one alkenyl group on each silicon atom at both terminals of the molecular chain represented by the following general formula (1):

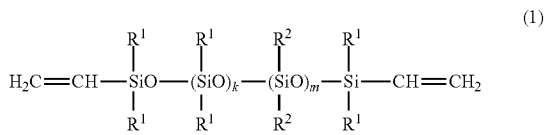

wherein, each $R^1$ represents the same or different, substituted or unsubstituted monovalent hydrocarbon group, each $R^2$ represents the same or different, substituted or unsubstituted monovalent hydrocarbon group which does not contain an unsaturated aliphatic bond, "k" and "m" are integers of 0 or more.

The monovalent hydrocarbon group of the foregoing $R^1$ preferably has 1 to 10 carbon atoms, particularly 1 to 6 carbon atoms. Illustrative examples thereof include alkyl groups such as a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group, and a decyl group; aryl groups such as a phenyl group, a tolyl group, a xylyl group, and a naphthyl group; aralkyl groups such as a benzyl group, a phenylethyl group, and a phenylpropyl group; alkenyl groups such as a vinyl group, an allyl group, a propenyl group, an isopropenyl group, a butenyl group, a hexenyl group, a cyclohexenyl group, an octenyl group; and groups in which hydrogen atoms of these groups are partially or fully substituted by a cyano group(s) or a halogen atom(s) such as fluorine, bromine, and chlorine, such as a chloromethyl group, a chloropropyl group, a bromoethyl group, a trifluoropropyl group.

The monovalent hydrocarbon group of the foregoing $R^2$ preferably has 1 to 10 carbon atoms, particularly 1 to 6 carbon atoms. Illustrative examples thereof include the same ones as in the foregoing examples of $R^1$ with the proviso that alkenyl groups are excluded.

The foregoing "k" and "m" are integers of 0 or more, preferably integers of satisfying 0<k+m≤10,000, more preferably integers of satisfying 5≤k+m≤2,000 and 0<k/(k+m) ≤0.2.

The component (A) preferably contains a silicon atom-bonded aryl group and/or a silicon atom-bonded aralkyl group. In view of the refractive index, gas permeability, and viscosity, preferably 0 to 90%, more preferably 5 to 80%, further preferably 10 to 70% of the silicon atom-bonded groups in the component (A) is an aryl group and/or an aralkyl group. As the aryl group, a phenyl group and a tolyl group are preferable; as the aralkyl group, a benzyl group and so on are preferable; and a pheny group is particularly preferable.

Illustrative examples of the component (A) include the followings:

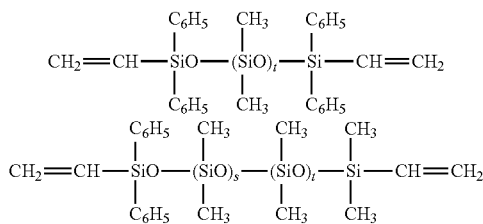

wherein, "s" and "t" are integers of 8 to 2,000 (both of them are average values);

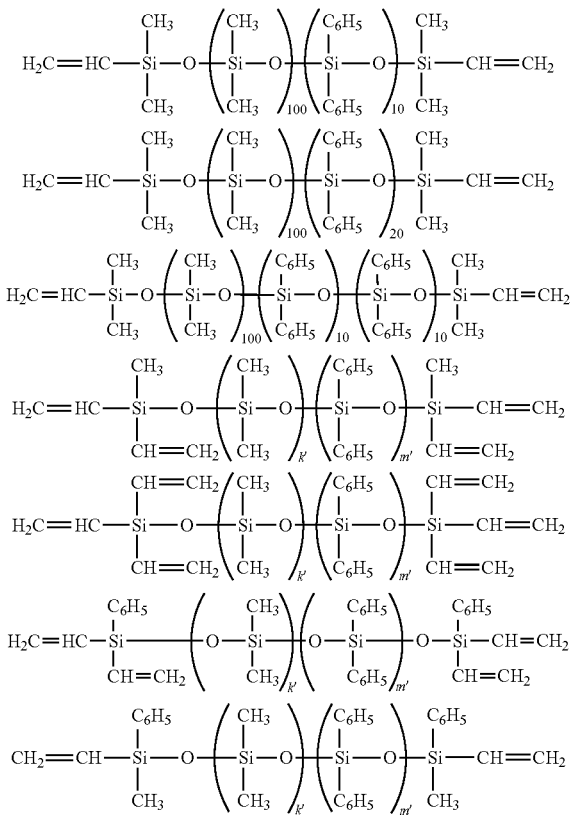

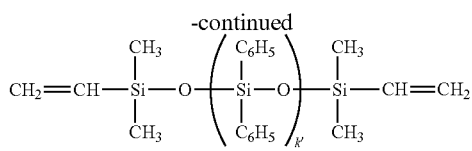

wherein, "k'" and "m'" are integers of 0 to 500 (both of them are average values).

The component (A) may be added alone or in combination of two or more kinds.

[(B) Branched Organopolysiloxane]

The component (B) is a branched organopolysiloxane comprising either or both of an $SiO_{4/2}$ unit and an $RSiO_{3/2}$ unit ("R" independently represents a monovalent hydrocarbon group having 1 to 10 carbon atoms), having two or more silicon atom-bonded alkenyl groups in one molecule, and having at least one group selected from a silicon atom-bonded alkoxy group having 1 to 10 carbon atoms and a silanol group in one molecule, and the total amount of the silicon atom-bonded alkoxy groups having 1 to 10 carbon atoms and the silanol groups in the component (B) is 0.01 to 0.6 mol/100 g.

As siloxane units composing the component (B), it only needs to include either or both of an $SiO_{4/2}$ unit (hereinafter, also referred to as a "Q unit") and an $RSiO_{3/2}$ unit (hereinafter, also referred to as a "T unit"), that is the siloxane chain only needs to have a branched-structure. Naturally it may also contain a $R_3SiO_{1/2}$ unit (hereinafter, also referred to as an "M unit", "R" has the same meaning as in the foregoing) and a $R_2SiO_{2/2}$ unit (hereinafter, also referred to as a "D unit", "R" has the same meaning as in the foregoing). In order to obtain a silicone resin composition which gives a cured product with excellent mechanical properties (e.g., strength), crack resistance, and sulfur resistance, the component (B) is preferably a resin in which the foregoing units are combined such as an MQ resin, an MDQ resin, an MDTQ resin, an MTQ resin, an MT resin, and an MDT resin.

The amount of the alkenyl groups contained in the component (B) is preferably in a range of 0.08 to 0.4 mol/100 g. When the amount of the alkenyl groups is 0.08 mol/100 g or more, it is possible to obtain appropriate crosslink density, thereby obtaining sufficient resin strength. When the amount of the alkenyl groups is 0.4 mol/100 g or less, it is possible to obtain appropriate hardness, thereby obtaining sufficient crack resistance.

The total amount of the silicon atom-bonded alkoxy groups having 1 to 10 carbon atoms and the silanol groups in the component (B) is 0.01 to 0.6 mol/100 g, preferably 0.05 to 0.5 mol/100 g, and more preferably 0.1 to 0.3 mol/100 g. When the total amount of the silicon atom-bonded alkoxy groups having 1 to 10 carbon atoms and the silanol groups is 0.01 mol/100 g or more, it is possible to avoid the risk of lowering the compatibility with a nano-particle of the component (E). When this amount is 0.6 mol/100 g or less, it is possible to avoid the risk of lowering the storage stability.

Moreover, each amount of the silicon atom-bonded alkoxy groups having 1 to 10 carbon atoms and the silanol groups in the component (B) is preferably 0 to 0.6 mol/100 g, more preferably 0 to 0.3 mol/100 g, with the proviso that the total amount is in the foregoing range of 0.01 to 0.6 mol/100 g.

The "R" in the M unit, D unit, and T unit is a monovalent hydrocarbon group having 1 to 10 carbon atoms, preferably 1 to 6 carbon atoms. Illustrative examples thereof include lower alkyl groups such as a methyl group, an ethyl group, a propyl group, and a butyl group; cycloalkyl groups such as a cyclohexyl group; aryl groups such as a phenyl group, a tolyl group, and a xylyl group; aralkyl groups such as a benzyl group; alkenyl groups such as a vinyl group, an allyl group, a propenyl group, an isopropenyl group, a butenyl group, a hexenyl group, a cyclohexenyl group, an octenyl group; and groups in which hydrogen atoms of these groups are partially or fully substituted by a cyano group(s) or a halogen atom(s) such as fluorine, bromine, and chlorine, such as a chloromethyl group, a cyanoethyl group, a 3,3,3-trifluoropropyl group.

The component (B) preferably contains a silicon atom-bonded aryl group and/or a silicon atom-bonded aralkyl group. In view of the refractive index, gas permeability, and viscosity, preferably 0 to 90%, more preferably 0.1 to 80%, further preferably 1 to 70% of the silicon atom-bonded groups in the component (B) is an aryl group and/or an aralkyl group. As the aryl group, a phenyl group and a tolyl group are preferable; as the aralkyl group, a benzyl group and so on are preferable; and a phenyl group is particularly preferable.

As a material to obtain the $SiO_{4/2}$ unit (Q unit), it is possible to use sodium silicate, tetra-alkoxysilane, or a condensate of these, for example.

Illustrative examples of the material to obtain the $RSiO_{3/2}$ unit (T unit) include organosilicon compounds represented by the following structural formulae such as organotrichlorosilane and organotrialkoxysilane, or a condensate of these, however, the material is not limited thereto.

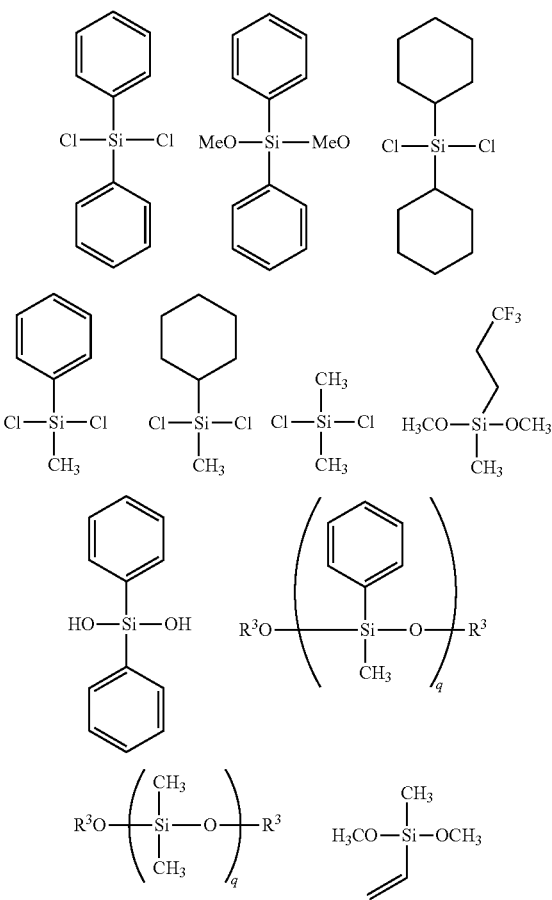

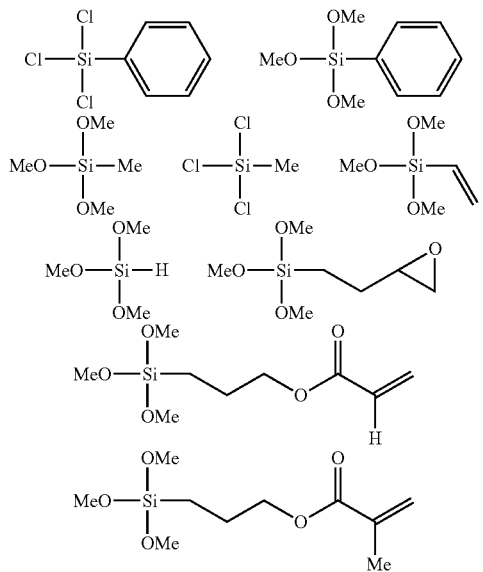

Illustrative examples of the material to obtain the $R_2SiO_{2/2}$ unit (D unit) include organosilicon compounds represented by the following structural formulae such as diorganodichlorosilane and diorganodialkoxysilane, however, the material is not limited thereto. In the following structural formulae, $R^3$ represents a hydrogen atom, an alkenyl group having 2 to 8 carbon atoms, or a substituted or unsubstituted monovalent hydrocarbon group which does not include an unsaturated aliphatic group; and "q" is an integer of 1 to 50.

Illustrative examples of the material to obtain the $R_3SiO_{1/2}$ unit (M unit) include organosilicon compounds represented by the following structural formulae such as triorganochlorosilane, triorganoalkoxysilane, and hexaorganodisiloxane, however, the material is not limited thereto.

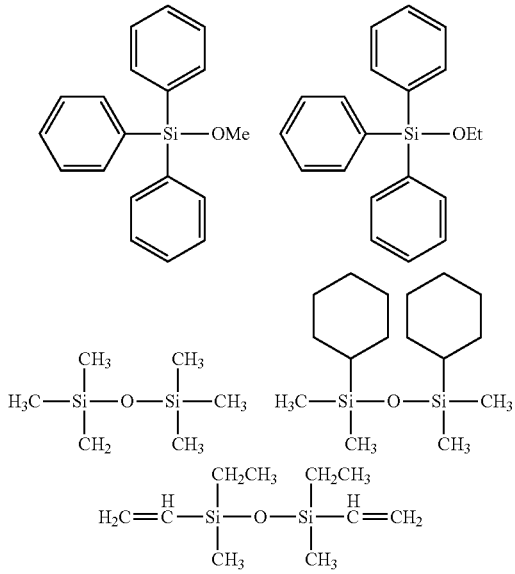

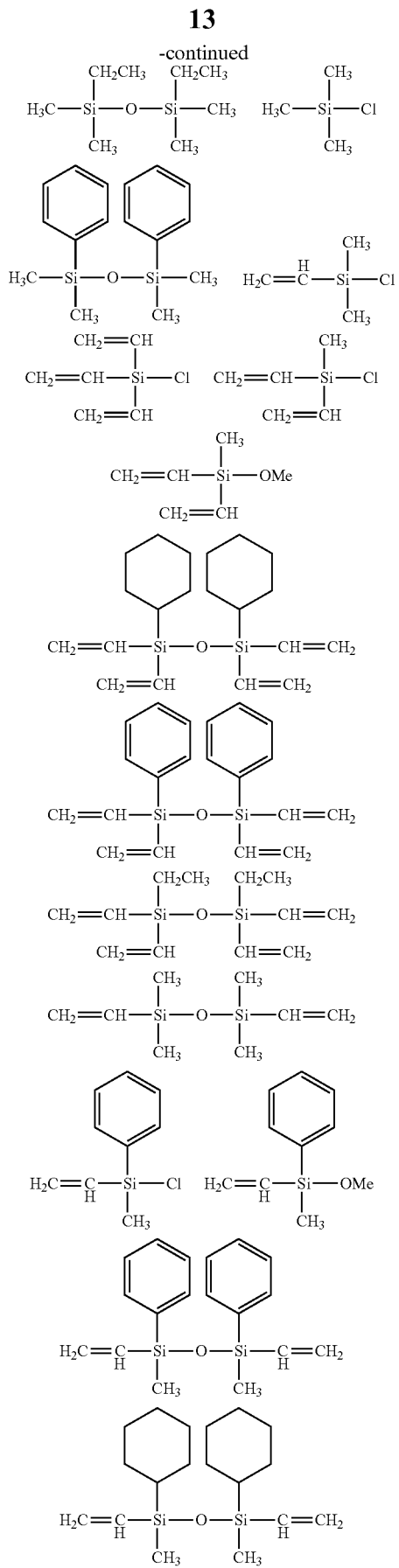
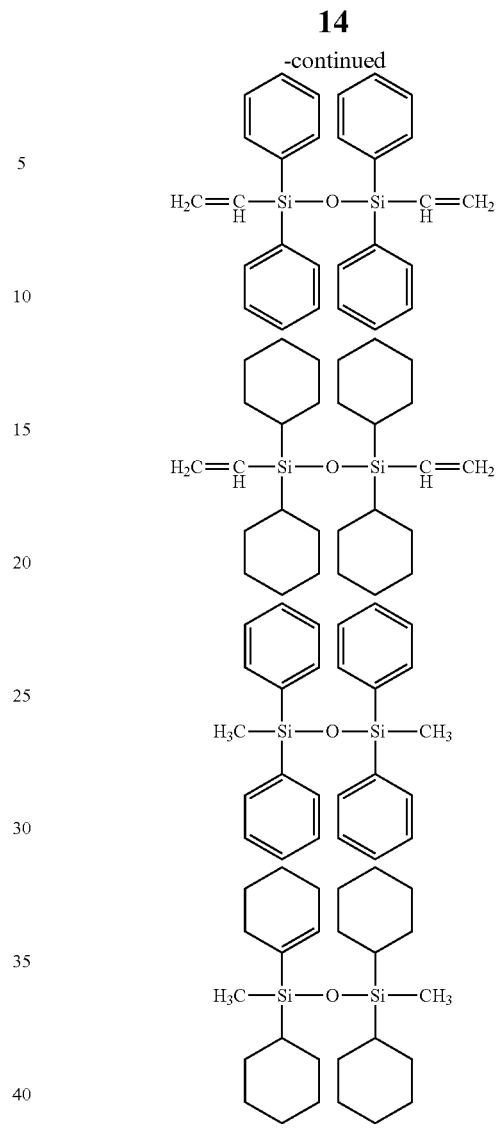

The amount of the component (B) is preferably 1 to 99% by mass relative to the total amount of the component (A) and the component (B). The component (B) can be added alone or in combination of two or more kinds.

[(C) Organosilicon Compound having Silicon Atom-bonded Hydrogen Atoms]

The component (C) is an organosilicon compound having two or more silicon atom-bonded hydrogen atoms and at least one silicon atom-bonded aryl group in one molecule.

The component (C) may contain a siloxane bonding or may not contain the same in the molecule. Illustrative examples of the component (C) which contains a siloxane bonding in the molecule (i.e., organohydrogenpolysiloxane) include dimethylpolysiloxane both terminals of which are blocked with dimethyl-hydrogensiloxy groups, diphenylpolysiloxane both terminals of which are blocked with dimethylhydrogen-siloxy groups, tris(hydrogendimethylsiloxy) phenylsilane, methylhydrogencyclopolysiloxane, a methylhydrogen-siloxane/diphenylsiloxane copolymer both terminals of which are blocked with trimethylsiloxy groups, a methylhydrogensiloxane/diphenylsiloxane/dimethylsiloxane copolymer both terminals of which are blocked with trimethylsiloxy groups; a copolymer composed of a $(CH_3)_2HSiO_{1/2}$ unit, a $(C_6H_5)_2SiO_{2/2}$ unit, and a $CH_3SiO_{3/2}$ unit; a copolymer composed of a $SiO_{4/2}$ unit, a $(C_6H_5)_2SiO_{2/2}$ unit, a $(C_6H_5)(CH_3)_2SiO_{1/2}$ unit, and a $(CH_3)_2HSiO_{1/2}$ unit; and a copolymer which contains a $(CH_3)_2HSiO_{1/2}$ unit, a $(C_6H_5)_2SiO_{2/2}$ unit, and/or a $(C_6H_5)(CH_3)_2SiO_{1/2}$ unit as an essential unit, and contains a $SiO_{4/2}$ unit and/or a $CH_3SiO_{3/2}$ unit as an optional unit; however the component (C) is not limited thereto. The examples of the component (C) which does not contain a siloxane bonding in the molecule include 1,4-bis(dimethylsilyl)benzene, bis{4-(dimethylsilyl)phenyl}dimethylsilane, but is not limited thereto.

The component (C) can be obtained generally by hydrolysis of chlorosilane such as $R^2SiHCl_2$, $R^2_3SiCl$, $R^2_2SiCl_2$, and $R^2_2SiHCl$ ($R^2$ is the same as in the foregoing) or equilibrating the siloxane obtained by the hydrolysis; but the producing method and raw materials are not limited thereto.

Although the viscosity of the component (C) is not particularly limited, the viscosity at 25° C. is preferably 1 to 100,000 mPa·s, more preferably 1 to 10,000 mPa·s.

The formulating amount of the component (C) is such that an amount of the silicon atom-bonded hydrogen atoms (SiH group) in the component (C) is 0.1 to 4.0 mol, preferably 0.3 to 3.0 mol relative to 1 mol of the total amount of the alkenyl groups in the component (A) and the component (B). When the amount of the SiH group is 0.1 mol or more, the curing reaction proceeds sufficiently, thereby curing the composition sufficiently. When the amount of the SiH group is 4.0 mol or less, the remaining of large quantity of unreacted SiH groups can be avoided, thereby suppressing the changes of the rubber properties with time.

The component (C) can be added alone or in combination of two or more kinds.

[(D) Platinum Group Metal Based Catalyst]

The component (D) is a platinum group metal based catalyst which is added in order to promote the addition curing reaction, and includes platinum based, palladium based, and rhodium based ones, for example. The platinum based ones such as platinum, platinum black, chloroplatinic acids are preferable in view of the cost. Illustrative examples thereof include $H_2PtCl_6 \cdot wH_2O$, $K_2PtCl_6$, $KHPtCl_6 \cdot wH_2O$, $K_2PtCl_4$, $K_2PtCl_4 \cdot wH_2O$, $PtO_2 \cdot wH_2O$ (wherein, "w" is a positive integer), etc.; and the complexes thereof with hydrocarbons such as olefin, alcohols, and vinyl group-containing organopolysiloxanes. The component (D) can be added alone or in combination of two or more kinds.

The formulating amount of the component (D) may be a so-called catalytic amount, which is generally in a range of 0.1 to 1,000 ppm, preferably 0.5 to 200 ppm in terms of platinum group metal (mass) relative to the total mass of the components (A) to (C). When the formulating amount of the component (D) is 0.1 ppm or more, the hydrosilylation reaction proceeds sufficiently, therefore a risk of an insufficient curing can be avoided. On the other hand, when the formulating amount of the component (D) is 1,000 ppm or less, a risk of coloring can be avoided.

[(E) Nanoparticle]

As the nanoparticle of the component (E), the foregoing inventive nanoparticle is used. The formulating amount of the component (E) is preferably 1 to 99% by mass relative to the total amount of the composition. The component (E) can be added alone or in combination of two or more kinds.

The inventive addition curing silicone resin composition can contain any known additives or an adhesion promoter in addition to the components (A) to (D), if needed. Illustrative examples of the adhesion promoter include phenyltrimethoxysilane, trimethoxysilane, triethoxysilane, methyldimethoxysilane, diphenyldimethoxysilane, methylphenyldimethoxysilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, 3-methacryloxypropylmethyldiethoxysilane, 3-methacryloxypropyltriethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, N-phenyl-3-aminopropyltrimethoxysilane, 3-mercaptopropyltrimethoxysilane, etc., and oligomers thereof. These adhesion promoters can be added alone or in combination of two or more kinds. The adhesion promoter is preferably added in an amount of 0 to 10% by mass, particularly 0 to 5% by mass relative to the total mass of the components (A) to (D).

Illustrative examples of the additives include reinforcing inorganic fillers such as glass fiber, fumed silica, fumed titanium dioxide; non-reinforcing inorganic fillers such as calcium carbonate, calcium silicate, titanium dioxide, ferric oxide, carbon black, zinc oxide. These can be appropriately added in an amount of 600 parts by mass or less (for example, 0 to 600 parts by mass, generally 1 to 600 parts by mass, preferably 10 to 400 parts by mass) relative to 100 parts by mass of the total of the components (A) to (D).

The inventive addition curing silicone resin composition can further contain (F) a fluorescent substance. The inventive addition curing silicone resin composition gives a cured product with excellent gas barrier properties, and, unlike the conventional arts, it does not have a risk to lower the fluorescent property significantly even when containing a fluorescent substance.

The inventive addition curing silicone resin composition can be prepared by mixing the forgoing components homogeneously. Generally, however, they stored with separated to two liquids in order to avoid progress of curing, and these two liquids are mixed to perform curing when using. In this case, it is preferred to store them with separating the component (C) and the component (D), since there is a risk of causing dehydrogenation when the component (C) and the component (D) are stored in one liquid. It is also possible to use as a single liquid by adding a small amount of a curing inhibitor such as acetylene alcohol.

In the addition curing silicone resin composition according to the present invention, it is preferable that 10 to 80% of the silicon atom-bonded groups contained in the composition be an aryl group. Such an addition curing silicone resin composition possesses further improved workability, and gives a cured product with more improved refractive index and gas barrier properties.

The inventive addition curing silicone resin composition preferably has a viscosity of 10 to 1,000,000 mPa·s at 25° C. measured by the method described in JIS K 7117-1:1999 when the component (E) is contained in an amount of 10% by mass relative to the total amount of the composition; and a viscosity ratio (x/y) is in a range of 0.5 to 3.0, where "x" is a viscosity of a composition X consisting of the components (A) to (E) at 25° C. measured by the method described in JIS K 7117-1:1999, "y" is a viscosity of a composition Y consisting of the components (A) to (D) contained in the composition X at 25° C. measured by the method described in JIS K 7117-1:1999. It is possible to fall the viscosity ratio (x/y) into the range of 0.5 to 3.0 by controlling the primary particle size of the nanoparticle or the amount of the alkoxy groups in the component (E). The addition curing silicone resin composition with such a viscosity ratio possesses more improved workability.

The inventive addition curing silicone resin composition can be applied to a prescribed substrate in accordance with the use and then cured. As a curing condition, although it can be cured sufficiently at a normal temperature (25° C.), it is also possible to perform heating to cure, if needed. When heating, the temperature may be set to 60 to 200° C., for example.

The inventive addition curing silicone resin composition preferably gives a cured product with a direct light transmittance of 70% or more at a wavelength of 400 to 800 nm, particularly 450 nm when cured by heating to a thickness of 1 mm. Incidentally, in a measurement of a direct light transmittance, it is possible to use spectrophotometer U-4100 manufactured by Hitachi, Ltd., for example.

The inventive addition curing silicone resin composition preferably gives a cured product with a refractive index of 1.37 to 1.57 when cured by heating.

The composition which gives a cured product having such a direct light transmittance or a refractive index has superior transparency, and therefore it can be preferably used for optical uses such as an encapsulant for LED.

Such an inventive addition curing silicone resin composition has low viscosity and good workability, and gives a cured product with excellent mechanical properties, transparency, crack resistance, heat resistance, and gas barrier properties.

<Semiconductor Apparatus>

The present invention also provides a semiconductor apparatus in which a semiconductor device is encapsulated by a cured product of the addition curing silicone resin composition of the present invention.

As described above, the inventive addition curing silicone resin composition gives a cured product with excellent transparency and gas barrier properties (moisture resistance). Accordingly, the inventive addition curing silicone resin composition is suitable for a lens material, a protective coating agent, a molding agent, etc. for a light emitting semiconductor apparatus, and is particularly useful for encapsulating LED devices such as blue LED, white LED, ultraviolet LED, etc. Moreover, the inventive addition curing silicone resin composition has excellent gas barrier properties, and therefore it can provide a light emitting semiconductor apparatus which can secure long-time reliability under high humidity and has excellent moisture resistance and long-time color rendering property even when used as a material for a wavelength conversion film by adding a silicate based fluorescent substance or a quantum dot fluorescent substance with inferior water resistance.

In encapsulating a light emitting semiconductor device such as LED with the inventive addition curing silicone resin composition, for example, it is possible to encapsulate an LED device with a cured product of the inventive addition curing silicone resin composition by applying the inventive addition curing silicone resin composition onto an LED device mounted on a pre-mold package made of thermoplastic resin, followed by curing the composition on the LED device. It is also possible to apply the composition onto an LED device in a state of varnish prepared by dissolving the composition to an organic solvent such as toluene or xylene.

The inventive addition curing silicone resin composition has excellent properties such as heat resistance, ultraviolet resistance, transparency, crack resistance, and long-time reliability. Accordingly, the inventive addition curing silicone resin composition is an optimum material for optical uses such as display material, optical memory media material, optical apparatus material, optical parts material, optical fiber material, photofunctional-electronfunctional organic material, and peripheral materials for semiconductor integrated circuit.

EXAMPLES

Hereinafter, the present invention will be specifically described with reference to Synthesis Examples, Comparative Synthesis Examples, Examples, and Comparative Examples, but the present invention is not restricted thereto. It is to be noted that the parts represents a parts by mass, and the viscosities are the values measured at 25° C. with a rotational viscometer by the method described in JIS K 7117-1:1999.

Synthesis Example 1

To a 1 L glass flask, 300 g of silica sol dispersed in methanol ($SiO_2$ concentration: 30% by mass, trade name: methanol silica sol, product of Nissan Chemical Industries, Ltd.) was weighed and introduced, and then 6 g of phenyltrimethoxysilane was added. This was heated at 60° C. for 6 hours with stirring. Then, 500 g of n-butanol was added, heating and stirring were carried out with removing the methanol under normal pressure until the temperature reached 100° C. The obtained silica sol dispersed in butanol was subjected to solvent displacement with toluene, and thus phenylsilane modified silica sol dispersed in toluene ($SiO_2$ concentration: 30% by mass, primary particle size: 10 nm, the amount of n-butoxy groups: 0.20 mol/100 g, the amount of methoxy groups: 0.08 mol/100 g) was obtained.

Synthesis Example 2

The same operation as in Synthesis Example 1 was carried out except that phenylmethyldimethoxysilane was used instead of phenyltrimethoxysilane in Synthesis Example 1 to obtain methylphenylsilane modified silica sol dispersed in toluene ($SiO_2$ concentration: 30% by mass, primary particle size: 15 nm, the amount of n-butoxy groups: 0.4 mol/100 g, the amount of methoxy groups: 0.1 mol/100 g).

Synthesis Example 3

The same operation as in Synthesis Example 1 was carried out except that methyltrimethoxysilane was used instead of phenyltrimethoxysilane in Synthesis Example 1 to obtain methylsilane modified silica sol dispersed in toluene ($SiO_2$ concentration: 30% by mass, primary particle size: 8 nm, the amount of n-butoxy groups: 0.21 mol/100 g, the amount of methoxy groups: 0.09 mol/100 g).

Synthesis Example 4

To a 1 L glass flask, 300 g of n-butoxy group-containing silica sol dispersed in toluene ($SiO_2$ concentration: 40% by mass, trade name: TOL-ST, product of Nissan Chemical Industries, Ltd.) was weighed and introduced, and then 6 g of trimethoxysilane was added. This was heated at 80° C. for 6 hours with stirring. By the foregoing operation, hydrosilane modified silica sol dispersed in toluene ($SiO_2$ concentration: 30% by mass, primary particle size: 30 nm, the amount of n-butoxy groups: 0.22 mol/100 g, the amount of methoxy groups: 0.02 mol/100 g) was obtained.

Synthesis Example 5

The same operation as in Synthesis Example 4 was carried out except that nano-zirconia particle ($ZrO_2$ concentration: 30% by mass, trade name: NanoUse OZ-S30M, product of Nissan Chemical Industries, Ltd.) was used instead of n-butoxy group-containing silica sol dispersed in toluene in Synthesis Example 4 to obtain hydrosilane modified nano-zirconia sol dispersed in toluene ($ZrO_2$ concentration: 30% by mass, primary particle size: 10 nm, the amount of methoxy groups: 0.1 mol/100 g).

Synthesis Example 6

To a 1 L glass flask, 300 g of silica sol dispersed in methanol ($SiO_2$ concentration: 30% by mass, trade name: methanol silica sol, product of Nissan Chemical Industries, Ltd.) was weighed and introduced, then 30 g of phenyltrichlorosilane was added, and 30 g of water was further added. This was heated at 80° C. for 6 hours with stirring. The resulting solution was subjected to solvent displacement with toluene, followed by washing with water and azeotropic dehydration treatment, and thus phenylsilane modified silica sol dispersed in toluene ($SiO_2$ concentration: 30% by mass, primary particle size: 25 nm, the mount of methoxy groups: 0.001 mol/100 g) was obtained.

Comparative Synthesis Example 1

To a 1 L glass flask, 300 g of silica sol dispersed in methanol ($SiO_2$ concentration: 30% by mass, trade name: methanol silica sol, product of Nissan Chemical Industries, Ltd.) was weighed and introduced, and then 0.6 g of phenyltrimethoxysilane was added. This was heated at 60° C. for 6 hours with stirring. Then, 500 g of n-butanol was added, heating and stirring were carried out with removing the methanol under normal pressure until the temperature reached 100° C. The obtained silica sol dispersed in butanol was subjected to solvent displacement with toluene, and thus phenylsilane modified silica sol dispersed in toluene ($SiO_2$ concentration: 30% by mass, primary particle size: 10 nm, the amount of n-butoxy groups: 0.5 mol/100 g, the amount of methoxy groups: 0.1 mol/100 g) was obtained.

Comparative Synthesis Example 2

The same operation as in Synthesis Example 2 was carried out except that large particle-size silica ($SiO_2$ concentration: 40% by mass, trade name: MA-ST-L, product of Nissan Chemical Industries, Ltd.) was used instead of silica sol dispersed in methanol in Synthesis Example 2 to obtain methylphenylsilane modified silica sol dispersed in toluene. ($SiO_2$ concentration: 30% by mass, primary particle size: 40 nm, the amount of n-butoxy groups: 0.1 mol/100 g, the amount of methoxy groups: 0.01 mol/100 g).

Comparative Synthesis Example 3

To a 1 L glass flask, 300 g of silica sol dispersed in methanol ($SiO_2$ concentration: 30% by mass, trade name: methanol silica sol, product of Nissan Chemical Industries, Ltd.) was weighed and introduced, then 30 g of trimethylchlorosilane was added, and 30 g of water was further added. This was heated at 80° C. for 6 hours with stirring. The resulting material was washed with water, followed by azeotropic dehydration treatment, and thus trimethylsilane modified silica sol dispersed in methanol ($SiO_2$ concentration: 30% by mass, primary particle size: 25 nm, the mount of methoxy groups: 0.0006 mol/100 g) was obtained.

Example 1

As a component (A), 5 parts of linear organopolysiloxane represented by the following formula (viscosity: 4,000 mPa·s):

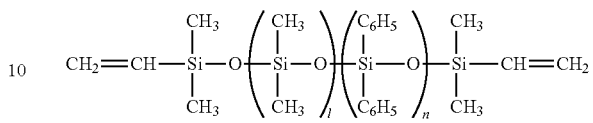

wherein, l=10 and n=8 (both of them are average values); as a component (B), 30 parts of branched vinylphenylmethylpolysiloxane composed of 36 mol % of $SiO_{4/2}$ unit, 36 mol % of $Ph_2SiO_{2/2}$ unit, and 28 mol % of $ViMe_2SiO_{1/2}$ unit (PVMQ; Mw=2,000; the amount of hydroxyl groups: 0.05 mol/100 g, the amount of alkoxy groups (methoxy groups): 0.2 mol/100 g); as a component (C), organohydrogenpolysiloxane represented by the following formula (Mw=530):

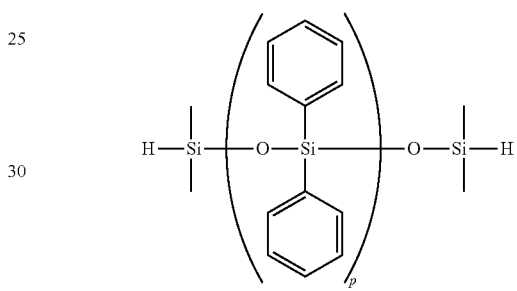

wherein, p=2 (average value), in the amount such that the ratio of the total number of silicon atom-bonded hydrogen atoms (SiH) in the component (C) to the total number of silicon atom-bonded vinyl groups (SiVi) in the component (A) and the component (B) (hereinafter, also referred to as "SiH/SiVi ratio") was 1.0; as a component (E), phenylsilane modified silica sol dispersed in toluene synthesized in Synthesis Example 1, in the amount to be 10% by mass of the total amount of the composition; were mixed, and the solvent was distilled off. Then, as a component (D), 0.05 parts of octyl alcohol modified solution of chloroplatinic acid (platinum element content: 2% by mass) was added, and well-stirred to prepare an addition curing silicone resin composition. It is to be noted that 48% of the silicon atom-bonded groups contained in the composition was a phenyl group. The properties of the composition and the curing product thereof were measured by the following methods. The results are shown in Table 1.

Example 2

The same operation as in Example 1 was carried out except that branched vinylmethylphenylpolysiloxane composed of 75 mol % of $PhSiO_{3/2}$ unit and 25 mol % of $ViMe_2SiO_{1/2}$ unit (PVMT; Mw=1,600; the amount of hydroxyl groups: 0.3 mol/100 g, free from alkoxy group) was used instead of the component (B) used in Example 1, and methylphenylsilane modified silica sol dispersed in toluene synthesized in Synthesis Example 2 was used instead of the component (E) used in Example 1 to prepare an addition curing silicone resin composition. The properties of the composition and the curing product thereof were measured as in Example 1. The results are shown in Table 1.

Example 3

The same operation as in Example 1 was carried out except that methylsilane modified silica sol dispersed in toluene synthesized in Synthesis Example 3 was used instead of the component (E) used in Example 1 to prepare an addition curing silicone resin composition. The properties of the composition and the curing product thereof were measured as in Example 1. The results are shown in Table 1.

Example 4

The same operation as in Example 1 was carried out except that hydrosilane modified silica sol dispersed in toluene synthesized in Synthesis Example 4 was used instead of the component (E) used in Example 1 to prepare an addition curing silicone resin composition. The properties of the composition and the curing product thereof were measured as in Example 1. The results are shown in Table 1.

Example 5

The same operation as in Example 1 was carried out except that hydrosilane modified nano-zirconia sol dispersed in toluene synthesized in Synthesis Example 5 was used instead of the component (E) used in Example 1 to prepare an addition curing silicone resin composition. The properties of the composition and the curing product thereof were measured as in Example 1. The results are shown in Table 1.

Example 6

The same operation as in Example 1 was carried out except that 1,4-bis(dimethylsilyl)benzene was used instead of the component (C) used in Example 1, and phenylsilane modified silica sol dispersed in toluene synthesized in Synthesis Example 6 was used instead of the component (E) used in Example 1 to prepare an addition curing silicone resin composition. The properties of the composition and the curing product thereof were measured as in Example 1. The results are shown in Table 1.

Example 7

As a component (A), 20 parts of linear organopolysiloxane represented by the following formula (viscosity: 600 mPa·s):

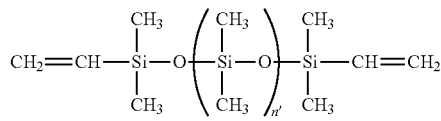

wherein, n'=50 (average value); as a component (B), 30 parts of branched vinylmethylpolysiloxane composed of 60 mol % of $SiO_{4/2}$ unit and 40 mol % of $Me_2ViSiO_{1/2}$ unit (VMQ; Mw=4,400; the amount of hydroxyl groups: 0.3 mol/100 g, the amount of alkoxy groups (methoxy groups): 0.1 mol/100 g); as a component (C), organohydrogenpolysiloxane composed of 50 mol % of $HMeSiO_{2/2}$ unit, 45 mol % of $Me_2SiO_{2/2}$ unit, and 5 mol % of $Me_3SiO_{1/2}$ unit (Mw=5,400), in the amount such that SiH/SiVi ratio was 1.0; as a component (E), methylsilane modified silica sol dispersed in toluene synthesized in Synthesis Example 3, in the amount to be 10% by mass of the total amount of the composition; were mixed, and the solvent was distilled off. Then, as a component (D), 0.05 parts of octyl alcohol modified solution of chloroplatinic acid (platinum element content: 2% by mass) was added, and well-stirred to prepare an addition curing silicone resin composition. The properties of the composition and the curing product thereof were measured by the following methods. The results are shown in Table 2.

Comparative Example 1

The same operation as in Example 1 was carried out except that phenylsilane modified silica sol dispersed in toluene synthesized in Comparative Synthesis Example 1 was used instead of the component (E) used in Example 1 to prepare an addition curing silicone resin composition. The properties of the composition and the curing product thereof were measured as in Example 1. The results are shown in Table 1.

Comparative Example 2

The same operation as in Example 1 was carried out except that methylphenylsilane modified silica sol dispersed in toluene synthesized in Comparative Synthesis Example 2 was used instead of the component (E) used in Example 1 to prepare an addition curing silicone resin composition. The properties of the composition and the curing product thereof were measured as in Example 1. The results are shown in Table 1.

Comparative Example 3

The same operation as in Example 7 was carried out except that trimethylsilane modified silica sol dispersed in methanol synthesized in Comparative Synthesis Example 3 was used instead of the component (E) used in Example 7 to prepare an addition curing silicone resin composition. The properties of the composition and the curing product thereof were measured as in Example 7. The results are shown in Table 2.

The properties of the compositions prepared in Examples and Comparative Examples and the cured products of these were measured by the following method.

(1) Appearance

The color and the transparency of the cured product (120 mm×110 mm×1 mm) obtained by curing each composition at 150° C. for 4 hours were visually observed.

(2) Refractive Index

The refractive index at 589 nm, 25° C. of the cured product (120 mm×110 mm×1 mm) obtained by curing each composition at 150° C. for 4 hours was measured with an Abbe refractometer based on JIS K 7142:2008.

(3) Viscosity and Viscosity Ratio before and after Addition of Component (E)

In each of the compositions, the viscosity (y) which is one before an addition of component (E) and the viscosity (x) which is one after the addition of component (E) were measured at 25° C. with a rotational viscometer based on JIS K 7117-1:1999, and viscosity ratio (x/y) was determined.

(4) Hardness (Type D)

The hardness of the cured product (120 mm×110 mm×1 mm) obtained by curing each composition at 150° C. for 4 hours was measured with a durometer D hardness tester based on JIS K 6249:2003.

(5) Elongation at Break and Tensile Strength

The elongation at break and the tensile strength of the cured product (120 mm×110 mm×1 mm) obtained by curing each composition at 150° C. for 4 hours were measured based on JIS K 6249:2003.

(6) Water-vapor Permeability

The water-vapor permeability of the cured product (the thickness of 1 mm) obtained by curing each composition at 150° C. for 4 hours was measured with a water vapor transmission rate measurement apparatus (Lyssy, L80-5000) based on JIS K 7129:2008.

(7) Heat Resistance (Light Transmittance Retention Ratio) and Crack Resistance

The light transmittance at a wavelength of 450 nm of the cured product (the thickness of 1 mm) obtained by curing each composition at 150° C. for 4 hours was measured at 23° C. with a Hitachi spectrophotometer U-4100 (initial transmittance). Then, each cured product was subjected to heat treatment at 150° C. for 1,000 hours, followed by measuring the light transmittance in the same way to determine the light transmittance after the heat-treatment relative to the initial transmittance (100%). Further, it was visually observed whether a crack exists or not in each cured product after the heat treatment.

(8) Sulfur Resistance (Luminance Retention Ratio)

Using each composition, a 3528PPA package with a silver substrate was encapsulated, followed by curing at 150° C. for 4 hours to measure the initial luminance. Then, the encapsulated 3528PPA package and 3 g of sodium sulfide were introduced in a metal container with a capacity of 700 cm$^3$, the metal container was sealed, and then the metal container was heated at 100° C. for 50 hours. Subsequently, the metal container was cooled to 25° C., then the encapsulated 3528PPA package was taken out to measure the luminance again, and the luminance retention ratio was determined relative to the initial luminance (100%).

(9) Adhesiveness

Onto a silver plate with an area of 180 mm$^2$, 0.25 g of each composition was molded so as to have the base area of 45 mm$^2$, followed by curing at 150° C. for 4 hours. Subsequently, the cured product was broken with a micro spatula, and when it was removed from the silver plate, the ratio of a part of cohesive failure and a part of peeling was determined to evaluate the adhesiveness.

(Evaluation Criterion)

o: good adhesiveness (the ratio of cohesive failure was 60% or more)

x: bad adhesiveness (the ratio of cohesive failure was less than 60%)

(10) Dust Adhesion due to Surface Tackiness

It was visually observed whether dust adhesion exist or not on the surface of the cured product obtained by curing each composition at 150° C. for 4 hours.

TABLE 1

| | Example 1 | Example 2 | Example 3 | Example 4 | Example 5 | Example 6 | Comparative Example 1 | Comparative Example 2 |
|---|---|---|---|---|---|---|---|---|
| Appearance | Colorless translucent | Colorless translucent | Colorless translucent | Colorless translucent | Colorless translucent | Colorless translucent | Colorless translucent | Cloudiness |
| Refractive index | 1.53 | 1.54 | 1.53 | 1.53 | 1.56 | 1.53 | 1.53 | 1.53 |
| Viscosity (x) after addition of component (E) [Pa · s] | 3.3 | 7.8 | 3.7 | 3.5 | 4.0 | 2.3 | 3.6 | 60 |
| Viscosity (y) before addition of component (E) [Pa · s] | 1.8 | 2.5 | 1.8 | 1.8 | 1.8 | 1.0 | 1.8 | 1.8 |
| Viscosity ratio (x/y) | 1.8 | 3.1 | 2.1 | 1.9 | 2.2 | 2.3 | 2.0 | 33.3 |
| Hardness (Type D) | 50 | 53 | 42 | 46 | 48 | 60 | 30 | 51 |
| Elongation at break [%] | 60 | 70 | 60 | 50 | 40 | 40 | 40 | 46 |
| Tensile strength [MPa] | 4.5 | 5.1 | 4.3 | 3.8 | 2.8 | 10 | 3.5 | 4.9 |
| Water-vapor permeability [g/m$^2$ · day] | 6 | 6 | 6 | 6 | 6 | 5 | 9 | 7 |
| Heat resistance (light transmittance retention ratio) [%] | 85 | 84 | 88 | 80 | 76 | 81 | 85 | 50 |
| Crack after heat treatment | None | None | None | None | None | None | None | None |
| Sulfur resistance (luminance retention ratio) [%] | 85 | 87 | 84 | 85 | 81 | 80 | 70 | 81 |
| Adhesiveness | o | o | o | o | o | o | o | o |
| Dust adhesion due to surface tackiness | None | None | None | None | None | None | None | None |

TABLE 2

|  | Example 7 | Comparative Example 3 |
|---|---|---|
| Appearance | Colorless translucent | Colorless transparent |
| Refractive index | 1.42 | 1.42 |
| Viscosity (x) after addition of component (E) [Pa · s] | 9.8 | 9.3 |
| Viscosity (y) before addition of component (E) [Pa · s] | 3.6 | 3.6 |
| Viscosity ratio (x/y) | 2.7 | 2.6 |
| Hardness (Type D) | 30 | 28 |
| Elongation at break [%] | 70 | 73 |
| Tensile strength [MPa] | 2.8 | 2.3 |
| Water-vapor permeability [g/m$^2$ · day] | 30 | 45 |
| Heat resistance (light transmittance retention ratio) [%] | 73 | 83 |
| Crack after heat treatment | None | None |
| Sulfur resistance (luminance retention ratio) [%] | 72 | 50 |
| Adhesiveness | ○ | ○ |
| Dust adhesion due to surface tackiness | None | None |

As shown in Table 1, in Examples 1 to 6 using the inventive nanoparticle as each component (E), gave nearly transparent cured products with sufficient hardness, elongation at break, and tensile strength, as well as excellent refractive index, gas barrier properties (water-vapor permeability, sulfur resistance), heat resistance, crack resistance, and adhesiveness, and being free from dust adhesion due to surface tackiness. Moreover, each composition showed small viscosity ratio (x/y) and good workability even after the addition of component (E). On the other hand, in Comparative Example 1 using nanoparticle with the amount of alkoxy groups of more than 0.5 mol/100 g as a component (E), the cured product did not possess a sufficient hardness, and had higher water-vapor permeability compared to Examples 1 to 6 and inferior sulfur resistance. Furthermore, in Comparative Example 2 using nanoparticles with a primary particle size of more than 30 nm as a component (E), a transparent cured product was not obtained. The obtained cured product showed inferior heat resistance compared to that of Examples 1 to 6. Moreover, the composition changed its viscosity after the addition of component (E), which deteriorated the workability.

In both of Example 7 and Comparative Example 3, components (A) and components (B) having no aryl group were used. As shown in Table 2, even when using such components (A) and (B), the water-vapor permeability was decreased and the sulfur resistance was superior in Example 7 using the inventive nanoparticle as a component (E) compared to Comparative Example 3 using a nanoparticle with the amount of alkoxy groups of less than 0.001 mol/100 g as a component (E).

As described above, it has revealed that the inventive nanoparticle, being added to a silicone resin composition, enables the cured product thereof to possess excellent mechanical properties, transparency, crack resistance, heat resistance, and gas barrier properties, and enables the composition to have low viscosity and good workability even after the addition of the nanoparticle.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A nanoparticle of an inorganic oxide particle being surface-treated, wherein:
   a primary particle size of the nanoparticle measured by a dynamic light scattering method is 8 nm or more and 30 nm or less, and
   the nanoparticle contains alkoxy groups having 1 to 10 carbon atoms in an amount of 0.001 to 0.5 mol/100 g on the surface of the inorganic oxide particle.

2. The nanoparticle according to claim 1, wherein the inorganic oxide particle is any of silicon dioxide particle, zirconium oxide particle, titanium oxide particle, aluminum oxide particle, and zinc oxide particle.

3. The nanoparticle according to claim 1, wherein the nanoparticle contains a silicon atom-bonded hydrogen atom and/or at least one functional group selected from an alkyl group having 1 to 10 carbon atoms, a fluoroalkyl group having 1 to 10 carbon atoms in which at least one hydrogen atom of an alkyl group is substituted with a fluorine atom, an alkoxy group having 1 to 10 carbon atoms, an aryl group having 6 to 10 carbon atoms, an alkenyl group having 2 to 10 carbon atoms, a hydroxyl group, an epoxy group, and a (meth)acryl group.

4. The nanoparticle according to claim 2, wherein the nanoparticle contains a silicon atom-bonded hydrogen atom and/or at least one functional group selected from an alkyl group having 1 to 10 carbon atoms, a fluoroalkyl group having 1 to 10 carbon atoms in which at least one hydrogen atom of an alkyl group is substituted with a fluorine atom, an alkoxy group having 1 to 10 carbon atoms, an aryl group having 6 to 10 carbon atoms, an alkenyl group having 2 to 10 carbon atoms, a hydroxyl group, an epoxy group, and a (meth)acryl group.

5. An addition curing silicone resin composition, comprising organopolysiloxane having a silicon atom-bonded alkenyl group, an organosilicon compound having a silicon atom-bonded hydrogen atom, and an addition reaction catalyst, further comprising:
   the nanoparticle according to claim 1.

6. An addition curing silicone resin composition, comprising organopolysiloxane having a silicon atom-bonded alkenyl group, an organosilicon compound having a silicon atom-bonded hydrogen atom, and an addition reaction catalyst, further comprising:
   the nanoparticle according to claim 2.

7. An addition curing silicone resin composition, comprising organopolysiloxane having a silicon atom-bonded alkenyl group, an organosilicon compound having a silicon atom-bonded hydrogen atom, and an addition reaction catalyst, further comprising:
   the nanoparticle according to claim 3.

8. An addition curing silicone resin composition, comprising organopolysiloxane having a silicon atom-bonded alkenyl group, an organosilicon compound having a silicon atom-bonded hydrogen atom, and an addition reaction catalyst, further comprising:

the nanoparticle according to claim 4.

9. The addition curing silicone resin composition according to claim 5, wherein the addition curing silicone resin composition contains:
- (A) a linear organopolysiloxane having two or more alkenyl groups in one molecule with a viscosity of 10 to 1,000,000 mPa·s at 25° C. measured by the method described in JIS K 7117-1:1999;
- (B) a branched organopolysiloxane comprising either or both of an $SiO_{4/2}$ unit and an $RSiO_{3/2}$ unit ("R" independently represents a monovalent hydrocarbon group having 1 to 10 carbon atoms), having two or more silicon atom-bonded alkenyl groups in one molecule, and having at least one group selected from a silicon atom-bonded alkoxy group having 1 to 10 carbon atoms and a silanol group in one molecule, and the total amount of the silicon atom-bonded alkoxy groups having 1 to 10 carbon atoms and the silanol groups in the component (B) is 0.01 to 0.6 mol/100 g, wherein the amount of the component (B) is 1 to 99% by mass relative to the total amount of the component (A) and the component (B);
- (C) an organosilicon compound having two or more silicon atom-bonded hydrogen atoms and at least one silicon atom-bonded aryl group in one molecule, wherein the amount is such that an amount of the silicon atom-bonded hydrogen atoms in the component (C) is 0.1 to 4.0 mol relative to 1 mol of the total amount of the alkenyl groups in the component (A) and the component (B);
- (D) a platinum group metal based catalyst, wherein the amount is a catalytic amount; and
- (E) the nanoparticle, wherein the amount is 1 to 99% by mass relative to the total amount of the composition.

10. The addition curing silicone resin composition according to claim 6, wherein the addition curing silicone resin composition contains:
- (A) a linear organopolysiloxane having two or more alkenyl groups in one molecule with a viscosity of 10 to 1,000,000 mPa·s at 25° C. measured by the method described in JIS K 7117-1:1999;
- (B) a branched organopolysiloxane comprising either or both of an $SiO_{4/2}$ unit and an $RSiO_{3/2}$ unit ("R" independently represents a monovalent hydrocarbon group having 1 to 10 carbon atoms), having two or more silicon atom-bonded alkenyl groups in one molecule, and having at least one group selected from a silicon atom-bonded alkoxy group having 1 to 10 carbon atoms and a silanol group in one molecule, and the total amount of the silicon atom-bonded alkoxy groups having 1 to 10 carbon atoms and the silanol groups in the component (B) is 0.01 to 0.6 mol/100 g, wherein the amount of the component (B) is 1 to 99% by mass relative to the total amount of the component (A) and the component (B);
- (C) an organosilicon compound having two or more silicon atom-bonded hydrogen atoms and at least one silicon atom-bonded aryl group in one molecule, wherein the amount is such that an amount of the silicon atom-bonded hydrogen atoms in the component (C) is 0.1 to 4.0 mol relative to 1 mol of the total amount of the alkenyl groups in the component (A) and the component (B);
- (D) a platinum group metal based catalyst, wherein the amount is a catalytic amount; and
- (E) the nanoparticle, wherein the amount is 1 to 99% by mass relative to the total amount of the composition.

11. The addition curing silicone resin composition according to claim 7, wherein the addition curing silicone resin composition contains:
- (A) a linear organopolysiloxane having two or more alkenyl groups in one molecule with a viscosity of 10 to 1,000,000 mPa·s at 25° C. measured by the method described in JIS K 7117-1:1999;
- (B) a branched organopolysiloxane comprising either or both of an $SiO_{4/2}$ unit and an $RSiO_{3/2}$ unit ("R" independently represents a monovalent hydrocarbon group having 1 to 10 carbon atoms), having two or more silicon atom-bonded alkenyl groups in one molecule, and having at least one group selected from a silicon atom-bonded alkoxy group having 1 to 10 carbon atoms and a silanol group in one molecule, and the total amount of the silicon atom-bonded alkoxy groups having 1 to 10 carbon atoms and the silanol groups in the component (B) is 0.01 to 0.6 mol/100 g, wherein the amount of the component (B) is 1 to 99% by mass relative to the total amount of the component (A) and the component (B);
- (C) an organosilicon compound having two or more silicon atom-bonded hydrogen atoms and at least one silicon atom-bonded aryl group in one molecule, wherein the amount is such that an amount of the silicon atom-bonded hydrogen atoms in the component (C) is 0.1 to 4.0 mol relative to 1 mol of the total amount of the alkenyl groups in the component (A) and the component (B);
- (D) a platinum group metal based catalyst, wherein the amount is a catalytic amount; and
- (E) the nanoparticle, wherein the amount is 1 to 99% by mass relative to the total amount of the composition.

12. The addition curing silicone resin composition according to claim 8, wherein the addition curing silicone resin composition contains:
- (A) a linear organopolysiloxane having two or more alkenyl groups in one molecule with a viscosity of 10 to 1,000,000 mPa·s at 25° C. measured by the method described in JIS K 7117-1:1999;
- (B) a branched organopolysiloxane comprising either or both of an $SiO_{4/2}$ unit and an $RSiO_{3/2}$ unit ("R" independently represents a monovalent hydrocarbon group having 1 to 10 carbon atoms), having two or more silicon atom-bonded alkenyl groups in one molecule, and having at least one group selected from a silicon atom-bonded alkoxy group having 1 to 10 carbon atoms and a silanol group in one molecule, and the total amount of the silicon atom-bonded alkoxy groups having 1 to 10 carbon atoms and the silanol groups in the component (B) is 0.01 to 0.6 mol/100 g, wherein the amount of the component (B) is 1 to 99% by mass relative to the total amount of the component (A) and the component (B);
- (C) an organosilicon compound having two or more silicon atom-bonded hydrogen atoms and at least one silicon atom-bonded aryl group in one molecule, wherein the amount is such that an amount of the silicon atom-bonded hydrogen atoms in the component (C) is 0.1 to 4.0 mol relative to 1 mol of the total amount of the alkenyl groups in the component (A) and the component (B);
- (D) a platinum group metal based catalyst, wherein the amount is a catalytic amount; and
- (E) the nanoparticle, wherein the amount is 1 to 99% by mass relative to the total amount of the composition.

13. The addition curing silicone resin composition according to claim 9, wherein 10 to 80% of the silicon atom-bonded groups contained in the addition curing silicone resin composition is an aryl group.

14. The addition curing silicone resin composition according to claim 9, wherein the addition curing silicone resin composition has a viscosity of 10 to 1,000,000 mPa·s at 25° C. measured by the method described in JIS K 7117-1:1999 when the component (E) is contained in an amount of 10% by mass relative to the total amount of the composition; and a viscosity ratio (x/y) is in a range of 0.5 to 3.0, where "x" is a viscosity of a composition X consisting of the components (A) to (E) at 25° C. measured by the method described in JIS K 7117-1:1999, "y" is a viscosity of a composition Y consisting of the components (A) to (D) contained in the composition X at 25° C. measured by the method described in JIS K 7117-1:1999.

15. The addition curing silicone resin composition according to claim 5, wherein the addition curing silicone resin composition further comprises (F) a fluorescent substance.

16. The addition curing silicone resin composition according to claim 5, wherein the addition curing silicone resin composition gives a cured product with a direct light transmittance of 70% or more at a wavelength of 450 nm when cured by heating to a thickness of 1 mm.

17. The addition curing silicone resin composition according to claim 5, wherein the addition curing silicone resin composition gives a cured product with a refractive index of 1.37 to 1.57 when cured by heating.

18. A semiconductor apparatus, wherein a semiconductor device is encapsulated by a cured product of the addition curing silicone resin composition according to claim 5.

19. A method for producing a nanoparticle by surface-treatment of an inorganic oxide particle, wherein:

reacting an inorganic oxide particle having a primary particle size of 3 nm or more and 30 nm or less measured by a dynamic light scattering method with a surface-treatment agent containing an alkoxy group having 1 to 10 carbon atoms at 20 to 150° C. for 1 to 72 hours to perform a surface-treatment of the inorganic oxide particle, thereby producing the nanoparticle that contains alkoxy groups having 1 to 10 carbon atoms in an amount of 0.001 to 0.5 mol/100 g on the surface of the inorganic oxide particle.

* * * * *